(12) United States Patent
He (10) Patent No.: US 7,738,527 B2
(45) Date of Patent: Jun. 15, 2010

(54) WAVELENGTH SWITCHABLE SEMICONDUCTOR LASER USING HALF-WAVE COUPLED ACTIVE DOUBLE-RING RESONATOR

(76) Inventor: Jian-Jun He, Dept. of Optical Engineering, Zhejiang University, 38 Zheda Road, Hangzhou (CN) 310027

( * ) Notice: Subject to any disclaimer, the term of this patent is extended or adjusted under 35 U.S.C. 154(b) by 0 days.

(21) Appl. No.: 11/964,708

(22) Filed: Dec. 26, 2007

(65) Prior Publication Data
US 2008/0123701 A1    May 29, 2008

Related U.S. Application Data

(63) Continuation-in-part of application No. 11/306,520, filed on Dec. 30, 2005, now Pat. No. 7,382,817.

(51) Int. Cl.
*H01S 3/083* (2006.01)
(52) U.S. Cl. .......................... 372/94; 372/108; 385/15; 385/27; 385/30; 385/32
(58) Field of Classification Search ................ 372/94, 372/108; 385/15, 27, 30, 32
See application file for complete search history.

(56) References Cited

U.S. PATENT DOCUMENTS

| 5,574,807 A | * | 11/1996 | Snitzer | 385/24 |
| 7,145,660 B2 | * | 12/2006 | Margalit et al. | 356/477 |
| 2003/0081881 A1 | * | 5/2003 | Alegria et al. | 385/15 |

FOREIGN PATENT DOCUMENTS

JP        06-021538    *    1/1994

OTHER PUBLICATIONS

A. Yoshida et al "Cascaded transmission star coupler" Applied Optics, vol. 20, No. 14, Jul. 15, 1981.*

* cited by examiner

*Primary Examiner*—Minsun Harvey
*Assistant Examiner*—Yuanda Zhang (57) ABSTRACT

A semiconductor laser comprises two optical ring resonators, each comprising an optical waveguide electrically pumped to provide optical gain. The two ring resonators have different round-trip optical path lengths, and are coupled to each other through a half-wave optical coupler. The half-wave optical coupler has a predetermined cross-coupling coefficient and a 180-degree cross-coupling phase. The cross-coupling coefficient is substantially less than the self-coupling coefficients in order to achieve an optimal single-mode selectivity of the laser. The first ring resonator has an optical path length such that its resonant wavelengths correspond to a set of discrete operating channels. The second ring resonator has a slightly different length so that only one resonant wavelength coincides with one of the resonant wavelengths of the first ring resonator over the operating spectral window. The lasing action occurs at the common resonant wavelength. In operation, at least a portion of the optical waveguide in each of the first and the second ring resonators are forward biased to provide substantially equal round-trip optical gains. The second ring resonator is tuned by varying the effective refractive index of a portion of the waveguide through an electrical means, resulting in wavelength switching among the set of discrete operating wavelengths as determined by the first ring resonator.

15 Claims, 12 Drawing Sheets

WAVELENGTH SWITCHABLE SEMICONDUCTOR LASER USING HALF-WAVE COUPLED ACTIVE DOUBLE-RING RESONATOR

RELATED APPLICATIONS

This application is a continuation-in-part of U.S. patent application Ser. No. 11/306,520, filed on Dec. 30, 2005 now U.S. Pat. No. 7,382,817.

FIELD OF THE INVENTION

This invention relates generally to a semiconductor laser, and more particularly to a monolithically integrated single-mode semiconductor laser with digitally switchable wavelength using two half-wave coupled ring resonators.

BACKGROUND OF THE INVENTION

Widely tunable lasers are of great interest for both long-haul and metropolitan optical networks. Besides their use for source sparing with the advantages of reduced inventory and cost, they open the possibility of new system architectures with more efficient and more flexible network management. For example, the combination of tunable lasers with wavelength routers can provide large format-independent space switches and reconfigurable optical add/drop functions. High speed wavelength switching can also be used for wavelength based packet switching and optical CDMA.

Monolithically integrated semiconductor tunable lasers offer many advantages over external-cavity tunable lasers assembled from discrete components. They are compact, low-cost, and more reliable as they contain no moving parts. A conventional monolithic tunable laser usually comprises a multi-electrode structure for continuous tuning. A typical semiconductor tunable laser consists of a distributed Bragg reflector (DBR) grating, an active gain section, and a phase shift region. An electrode for electrical control is disposed on top of each of the three sections. When the reflection peak wavelength of the DBR grating is tuned by injecting current, the phase shift region must be adjusted simultaneously in order to prevent the laser from hopping from one mode to another. Besides, the tuning range of such a laser is limited to about 10 nm due to the limitation of commonly achievable refractive index change in semiconductor materials.

A more sophisticated tunable laser with a wider tuning range and improved performances was described by V. Jarayman, Z. M. Chuang, and L. A. Coldren, in an article entitled "Theory, design, and performance of extended tuning range semiconductor lasers with sampled gratings", IEEE J. Quantum Electron. Vol. 29, pp. 1824-1834, 1993. It comprises of four electrodes controlling two sampled grating distributed Bragg reflectors, a phase-shift region and a gain section. Similar structures have been developed in the form of superstructure grating (SSG) DBR laser, modulated grating Y-branch (MG-Y) laser and digital supermode (DS) DBR laser, as described, respectively, in Y. Tohmori, Y. Yoshikuni, H. Ishii, "Broad-range wavelength-tunable superstructure grating (SSG) DBR lasers," IEEE J. Quantum Electron. 29, 1817-1823 (1993); J.-O. Wesström, Gert Sarlet, Stefan Hammerfeldt, "State of the art performance of widely tunable modulated grating Y-branch lasers," Optical Fiber Communication Conference, Washington D. C., paper TuE2 (2004); and D. J. Robbins, G. Busico, L. Ponnampalam, J. P. Duck, P. J. Williams, R. A. Griffin, A. J. Ward, D. C. J. Reid, N. D. Whitbread, and E. Barton, "A high power, broadband tunable laser module based on a DS-DBR laser with integrated SOA," Optical Fiber Communication Conference, Washington D.C., Paper TuE3 (2004). In all these prior-art devices, the wavelength tuning requires complex electronic circuits with multidimensional current control algorithms and look-up tables. Such complexity reduces the fabrication yield and increases the cost, and also opens the questions about the manufacturability and long term stability of the devices.

A widely tunable or wavelength switchable laser can also be realized by using two coupled cavities of slightly different lengths. The coupled-cavity laser can be fabricated either by etching a groove inside a cleaved Fabry-Perot laser, as described in a paper entitled "Monolithic two-section GaInAsP/InP active-optical-resonator devices formed by reactive-ion-etching", by L. A. Coldren et al, Appl. Phys. Lett., vol. 38, pp. 315~317, 1981, or by using a cleaved-coupled-cavity, as described in a paper entitled "The cleaved-coupled-cavity (C3) laser", by W. T. Tsang, Semiconductors and Semimetals, vol. 22, p. 257, 1985. However, the performance of the prior-art coupled-cavity lasers in terms of mode selectivity is not satisfactory, which results in very limited use for practical applications.

Coupled-cavity lasers have also been investigated in the form of a Y-laser, as described in an article entitled "The Y-laser: A Multifunctional Device for Optical Communication Systems and Switching Networks", O. Hildebrand, M. Schilling, D. Baums, W. Idler, K. Dutting, G. Laube, and K. Wunstel, Journal of Lightwave Technology, vol. 1, no. 2, pp. 2066-2074, 1993, and the references therein. The Y-laser has the advantage of being monolithic without the challenging fabrication requirement for deeply and vertically etched trenches. However, the mode selectivity of the Y-laser is very poor, with a side-mode threshold difference of only about 1 $cm^{-1}$ for a 450 µm laser, compared to over 10 $cm^{-1}$ for a typical DFB laser. This is far from sufficient for stable single-mode operation.

It has also been proposed to use two passive ring resonators coupled to the waveguide in a Fabry-Perot laser for achieving single-mode widely tunable laser, as described in an article entitled "Passive Microring-Resonator-Coupled Lasers", by B. Liu, A. Shakouri, and J. E. Bowers, Appl. Phys. Lett., vol. 79, pp. 3561-3563, 2001, and in "A GaInAsP-InP Double-Ring Resonator Coupled Laser", by D. G. Rabus, Z. Bian, and A. Shakouri, IEEE Photonics Technology Letters, vol. 17, no. 9, pp. 1770-1772, 2005. These prior-art devices require an active Fabry-Perot cavity with cleaved facets, while the two ring resonators are used as passive transmissive filters inside the Fabry-Perot cavity to select the lasing mode. The device has a large size due to numerous elements and there is complexity due to the requirement that the filter transmission peaks of both ring resonators need to be tuned to match the Fabry-Perot mode for optimum performance.

For many applications, it is not necessary to tune the laser wavelength continuously. Rather, it is only required that the laser can be set to any discrete wavelength channel, e.g. as defined by the ITU (International Telecommunication Union). Such applications include linecard sparing, wavelength routing and optical add/drop. Key requirements for such wavelength switchable lasers are: 1) an accurate match of the discrete operating wavelengths with the predefined wavelength channels (e.g. ITU grid); 2) simple and reliable control for the switching between various channels; 3) high side-mode suppression ratio and low crosstalk; 4) fast switching speed; and 5) easy to fabricate and low cost.

In co-pending U.S. patent application Ser. No. 11/306,520 entitled "V-coupled-cavity semiconductor laser", a V-coupled cavity structure with an optimal coupling coefficient for high single-mode selectivity is disclosed for operation as a widely wavelength switchable laser. The present patent application discloses a half-wave coupled active double ring resonator structure which can achieve the same functionality and performance without deep-etched reflection mirrors or any additional Fabry-Perot cavity.

SUMMARY OF THE INVENTION

In accordance with the invention, there is provided, a semiconductor laser comprising:

a first optical ring resonator comprising a first optical waveguide, at least a portion of said first optical waveguide being pumped to provide optical gain, a second optical ring resonator comprising a second optical waveguide, at least a portion of said second optical waveguide being pumped to provide optical gain, whereas the first and the second optical ring resonators have different round-trip optical path lengths, and are coupled to each other through an optical coupler, said optical coupler having a predetermined cross-coupling coefficient and phase, whereas the cross-coupling coefficient is substantially less than the self-coupling coefficients and the cross-coupling phase is substantially equal to an integer multiple of $\pi$ relative to self-coupling phases for achieving an optimal single-mode selectivity of the laser.

BRIEF DESCRIPTION OF THE DRAWINGS

FIG. 4 is the power transfer function of a quarter-wave (a) and a half-wave (b) optical coupler.

DETAILED DESCRIPTION

Figure 1:
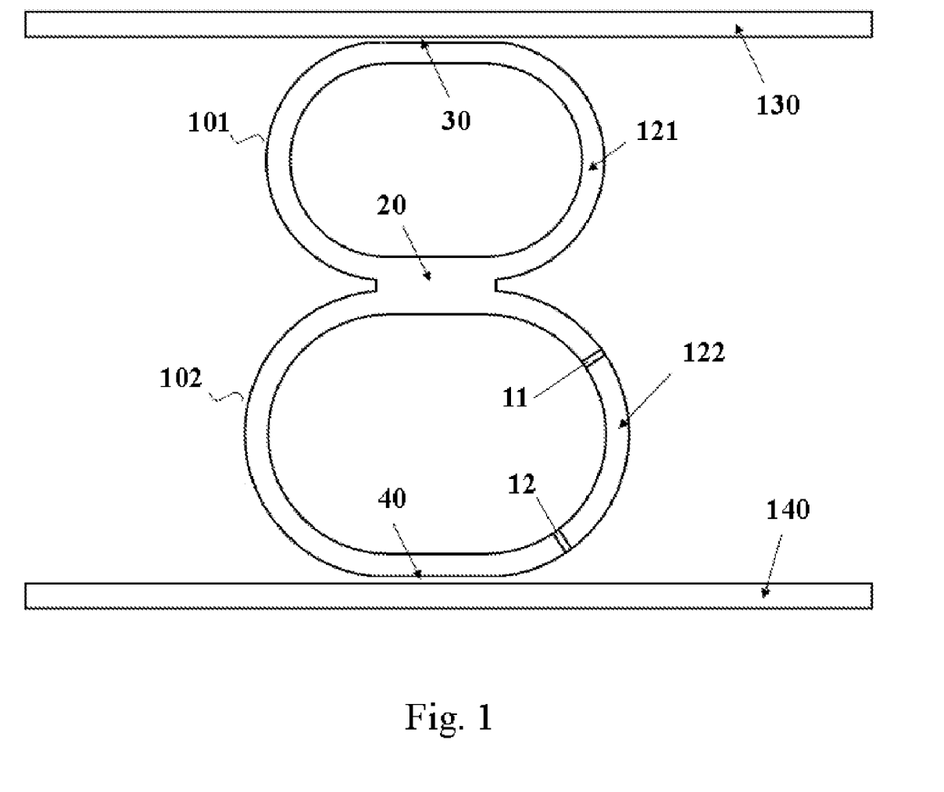
FIG. 1 is a schematic of a wavelength switchable semiconductor laser using half-wave coupled ring resonators in accordance with one embodiment of the present invention.

FIG. 1 shows the top view of a wavelength switchable semiconductor laser using half-wave coupled ring resonators in accordance with one embodiment of the present invention. The laser consists of two waveguide ring resonators 101 and 102, weakly coupled to each other via a half-wave optical coupler 20 with a predetermined coupling coefficient so that a small amount of light is coupled from one resonator to the other with a certain relative phase. The detail of the half-wave optical coupler is described later. At least one of the output couplers 30 and 40 is used to couple the laser emission from the ring resonators to at least one of the output waveguides 130 and 140. At least one electrode 121 is deposited on top of the ring resonator 101 and a portion of the ring resonator 102 to inject an essentially fixed current to produce optical gain for the laser. Another electrode 122 is deposited on top of the remaining portion of the ring resonator 102 to apply a variable current or voltage in order to change the refractive index of the underlying waveguide and to switch the laser wavelength. Hereafter the ring resonators 101 and 102 are referred as fixed gain resonator and channel selector resonator, respectively.

Figure 2:
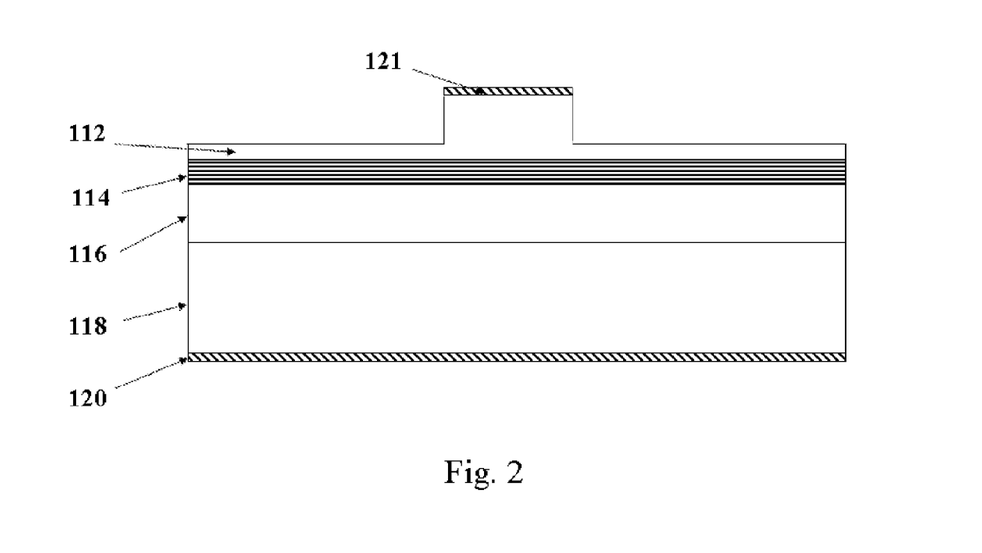
FIG. 2 is a typical cross-sectional view perpendicular to the waveguide of the laser.

A typical cross-sectional view perpendicular to the waveguides of the laser is shown in FIG. 2. The waveguide structure generally consists of a buffer layer 116, waveguide core layer 114 that provides an optical gain when electrically pumped, and an upper cladding layer 112, deposited on a substrate 118. The backside of the substrate is deposited with a metal electrode layer 120 as a ground plane. Preferably the waveguide core layer comprises multiple quantum wells and the layers are appropriately doped as in conventional laser structures. An example material system is InGaAsP/InP. In the transverse direction, standard ridge or rib waveguides are formed to laterally confine the optical mode in the ring resonators 101 and 102, with electrodes 121 and 122 deposited thereon.

The waveguide core in the wavelength switching segment under the electrode 122 preferably has a larger bandgap energy than that of the gain segments under the electrodes 121. This allows a large refractive index change to be obtained at the laser wavelength when an electrical current or voltage is applied on the electrode 122 without introducing a significant gain variation. The different bandgap energies in different sections of the monolithic device can be obtained by using a quantum well intermixing technique, selective area epitaxy or etch-and-regrowth method. The electrodes 121 and 122 are separated by shallow etched isolation trenches 11 and 12.

The waveguide length of the fixed gain resonator 101 is chosen so that its resonance frequency interval matches the spacing of the operating frequency grid, an example being the widely used frequency grid defined by ITU (e.g. spaced at 200 GHz, 100 GHz or 50 GHz). The resonance frequency interval is determined by $$\Delta f = \frac{c}{n_g L} \quad (1)$$

where c is the light velocity in vacuum, $n_g$ the effective group refractive index of the waveguide, and L the waveguide length of the fixed gain resonator 101.

Similarly, the resonance frequency interval $\Delta f'$ of the channel selector resonator 102 is determined by $$\Delta f' = \frac{c}{n'_g L'} = \frac{c}{(n_a L_a + n_b L_b)} \quad (2)$$

where $L_a$ and $L_b$ are the lengths of the segments of the channel selector resonator under the electrodes 121 and 122, respectively, $n_a$ and $n_b$ are the effective group refractive indices of the corresponding segments, $L'=L_a+L_b$ and $n'_g=(n_a L_a+n_b L_b)/L'$ are, respectively, the total waveguide length and the average effective group refractive index of the channel selector resonator 102.

Figure 3:
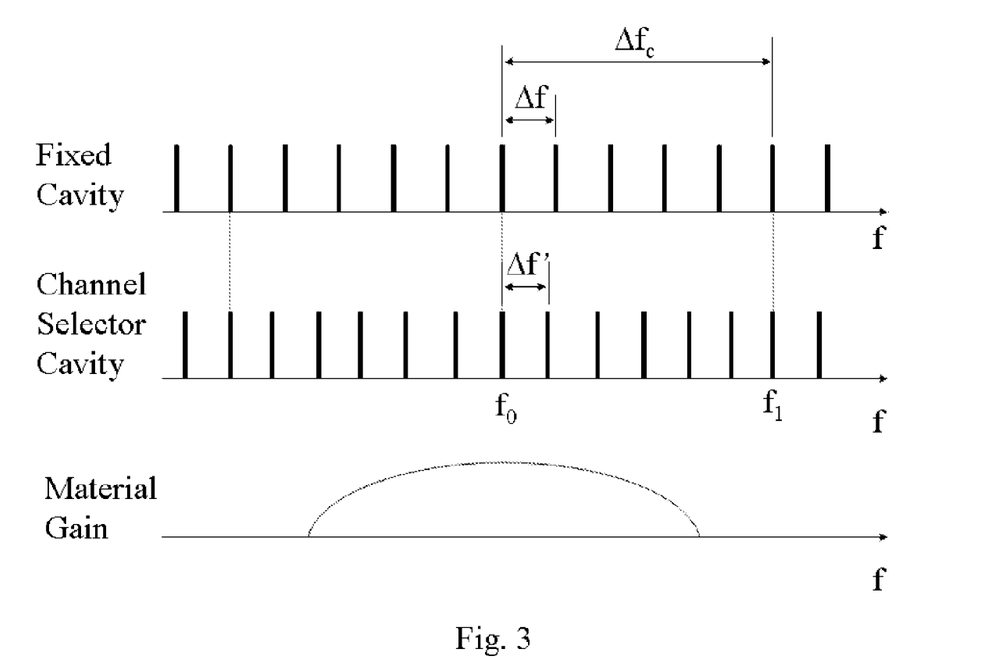
FIG. 3 is a schematic diagram showing the relationships between the two sets of resonant peaks of the fixed gain resonator and the channel selector resonator, and the material gain spectrum.

The resonance frequency interval $\Delta f'$ of the channel selector resonator is chosen to be slightly different than $\Delta f$ so that only one resonant peak coincides with one of the resonant peaks of the fixed gain resonator over the material spectral gain window, as shown in FIG. 3. The distance between two aligned resonant peaks, which corresponds to the free spectral range (FSR) of the coupled double-ring structure, is determined by $$\Delta f_c = \frac{\Delta f \Delta f'}{|\Delta f - \Delta f'|} \quad (3)$$

In order not to have two wavelengths lasing simultaneously, $\Delta f_c$ should generally be larger than the spectral width of the material gain window.

The resonant frequencies of the fixed gain resonator and the channel selector resonator are determined respectively by $$f = \frac{mc}{nL} \quad (4a)$$

$$f' = \frac{m'c}{n'L'} \quad (4b)$$

where m and m' are integers, n and n' the averaged effective refractive index of the waveguide within the respective resonator. The resonant frequency of the channel selector resonator can be tuned by varying the effective index n' or $n_b$ of the segment under the electrode 122. The rate of the tuning is determined by $$\frac{\delta f'}{f'} = -\frac{\delta n'}{n'} = -\frac{\delta n_b L_b}{n_b L'} \quad (5)$$

Since the laser frequency is determined by the resonant peak of the fixed gain resonator that coincides with a peak of the channel selector resonator, a shift of $|\Delta f-\Delta f'|$ in the resonant peaks of the channel selector resonator results in a jump of a channel in the laser frequency. Therefore, the change of the laser frequency with the refractive index variation is amplified by a factor of $\Delta f/|\Delta f-\Delta f'|$, i.e., $$\delta f = \frac{\Delta f}{|\Delta f - \Delta f'|} \delta f' \quad (6)$$

This is the so-called Vernier effect which is also used in other structures such as SSG or SG DBR lasers. However, since the frequency interval of the reflectivity peaks of the SSG or SG structure is determined by the modulation period in the grating and usually at least 10 periods are required in each of the front and back reflectors, they requires a total device length typically at least 10 times larger than the waveguide length of the ring resonators if the same frequency grid is used. The increased tuning range without long and complex grating structures is one of the advantages of the proposed device. And it does not require deeply and vertically etched reflecting trenches. Consider an example in which $\Delta f=100$ GHz, and $\Delta f'=90$ GHz, the range of the laser frequency variation is increased by a factor of 10 with respect to what can be achieved by the index variation directly. For this numerical example, assuming the effective group refractive index of the waveguide is 3.215, the waveguide lengths of the fixed gain resonator and the channel selector resonator are L=932.5 μm and L'=1036.6 μm, respectively, corresponding to radii R=148.4 μm and R'=165 μm if circular ring resonators are used.

Due to the practical limitations of device length and the associated loss, a SSG or SG DBR laser typically has $\Delta f$ larger than 600 GHz. For common DWDM applications with ITU channel spacing in the range of 50~200 GHz, digital wavelength switching is impossible and an external wavelength locking mechanism is required. This complexity is removed with the double-ring resonator laser of the present invention. The waveguide lengths of the ring resonator can be accurately defined by photolithographic method. Deviations from the ITU grid due to material dispersion or fabrication errors can be compensated by slightly adjusting the injection current in the fixed gain resonator (with or without an extra electrode) or by temperature tuning.

An important aspect of the coupled ring resonator laser of the present invention is that the coupling region is designed such that an optimized small amount of light is coupled from one resonator to the other (i.e. cross-coupling) with a predetermined phase, relative to the light coupled to the same resonator (i.e. self-coupling). This is critical for achieving high single-mode selectivity of the laser. In the following, we denote the amplitude coupling coefficients from the fixed gain resonator 101 to the channel selector resonator 102 (cross-coupling), from the fixed gain resonator 101 to the fixed gain resonator 101 (self-coupling), from the channel selector resonator 102 to the fixed gain resonator 101 (cross-coupling), and from the channel selector resonator 102 to the channel selector resonator 102 (self-coupling), by $C_{12}$, $C_{11}$, $C_{21}$ and $C_{22}$, respectively. Consider the electrical fields $E_1$ and $E_2$ at arbitrary points $P_1$ and $P_2$ in the fixed gain resonator and the channel selector resonator, respectively. After passing through the coupling section and a round trip propagation, the electric field $E_1'$ and $E_2'$ can be written as $$E_1'=(C_{11}E_1 e^{(g+ik)L_p}+C_{21}E_2 e^{(g'+ik')L_p'})\tau e^{(g+ik)(L-L_p)} \quad (7)$$

$$E_2'=(C_{12}E_1 e^{(g+ik)L_p}+C_{22}E_2 e^{(g'+ik')L_p'})\tau' e^{(g'+ik')(L'-L_p')} \quad (8)$$

where $L_p$ is the waveguide length from point $P_1$ to the middle point of the coupling region measured along the fixed gain ring resonator in the counter clock wise direction and $L_p'$ is the waveguide length from point $P_2$ to the middle point of the coupling region measured along the channel selector ring resonator in the clock wise direction. τ is the transmission coefficient of the coupler 30 for the light propagating in the fixed gain resonator and τ' is the transmission coefficient of the coupler 40 for the light propagating in the channel selector resonator. Note that in the above equations we only consider one resonant mode propagating in one direction in each ring. The resonant mode propagating in the opposite direction can be suppressed or used for additional functionalities as will be discussed later. Besides, we do not distinguish the propagation constants in the coupled and uncoupled regions (the actual differences can be taken into account in the phases of the complex coupling coefficients). From the laser threshold conditions $E_1'=E_1$ and $E_2'=E_2$, we can obtain $$(C_{11} + \beta C_{21})\tau e^{(g+ik)L} = 1 \quad (9)$$

$$\left(C_{22} + \frac{C_{12}}{\beta}\right)\tau' e^{(g'+ik')L'} = 1 \quad (10)$$

with $$\beta = \frac{E_2 e^{(g'+ik')L_p'}}{E_1 e^{(g+ik)L_p}} \quad (11)$$

By eliminating β in Eqs. (9) and (10), we can obtain the threshold condition $$C_{11}\tau e^{(g+ik)L} + C_{22}\tau' e^{(g'+ik')L'} - (C_{11}C_{22}-C_{21}C_{12})\tau\tau' e^{(g+ik)L}e^{(g'+ik')L'} = 1 \quad (12)$$

This complex equation, which can be separated into two equations corresponding to the real and imaginary parts, determines the wavelengths of the lasing modes as well as their corresponding threshold gain coefficients.

Consider the case of a symmetrical coupler with $C_{11}=C_{22}$ and $C_{12}=C_{21}$. It will be shown later that the highest single-mode selectivity is reached when the two ring resonators are symmetrically pumped with equal round trip gain, i.e. $\tau e^{gL}=\tau' e^{g'L'}$. The lowest threshold lasing mode occurs when both of the two resonators are in resonant condition (i.e. for the resonant modes that are aligned at the same wavelength). In this case, from Eq. (9) and (10), we can derive $|\beta|^2=1$, i.e., the electric fields from the two ring resonators have the same amplitudes in the coupling region.

Now let us examine more closely the coupling region between the fixed gain resonator 101 and the channel selector resonator 102. For simplicity and without losing generality, the self-coupling coefficients $C_{11}$ and $C_{22}$ can be assumed to be of real positive values (any non-zero phase can be compensated by the waveguide lengths L and L', respectively), i.e. $C_{11}=|C_{11}|$ and $C_{22}=|C_{22}|$. Assume the cross-coupling coefficients have a relative phase φ with respect to the self-coupling coefficients, i.e. $C_{12}=|C_{12}|e^{i\phi}$ and $C_{21}=|C_{21}|e^{i\phi}$. Consider the case where the powers in the two ring resonators at the entrance of the coupling region are equal with the total power normalized to 1. The output powers in the two waveguides at the exit of the coupling region can then be written as $$P_1 = \frac{1}{2}[|C_{11}|^2 + |C_{21}|^2 + 2|C_{11}||C_{21}|\cos(\varphi + \phi)] \quad (13)$$

$$P_2 = \frac{1}{2}[|C_{12}|^2 + |C_{22}|^2 + 2|C_{12}||C_{22}|\cos(\varphi - \phi)] \quad (14)$$

where φ is the relative phase of the input field at the entrance of the coupling region in the second ring resonator (e.g. the channel selector resonator) with respect to that in the first ring resonator (e.g. the fixed gain resonator).

Figure 4A:
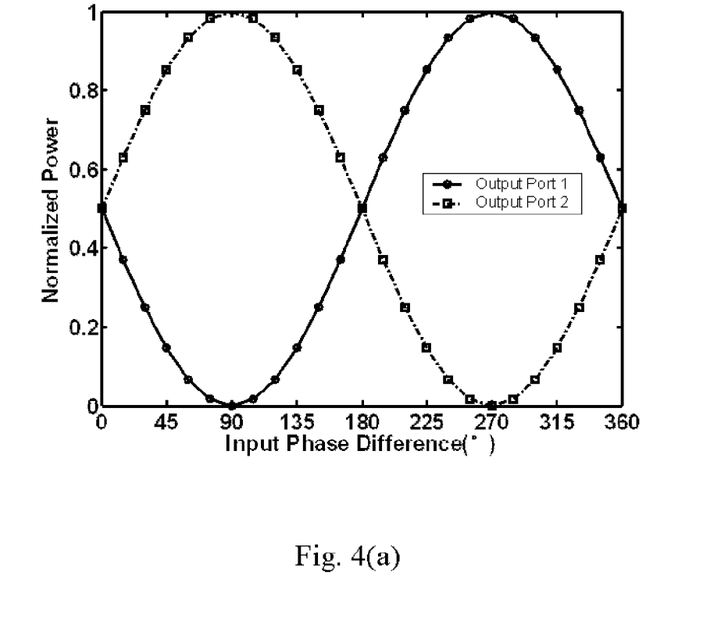

In a conventional 2×2 optical coupler, the cross-coupling coefficient has a relative phase of π/2 with respect to the bar-coupling coefficient, i.e. φ=π/2. Therefore, the two output waveguides have complementary output powers when the relative phase of the two input fields changes. FIG. 4(a) shows the typical curves of output power versus relative input phase for a 3-dB directional coupler or a 2×2 multi-mode interference (MMI) coupler. For an ideal coupler, the energy conservation rule leads to $|C_{11}|^2+|C_{21}|^2=1$ and $|C_{12}|^2+|C_{22}|^2=1$. Such a coupler (referred as quarter-wave optical coupler below) is commonly used in waveguide based Mach-Zehnder interferometers and optical switches. It has also been used in optical filters based on multiple coupled ring resonators.

Figure 4B:
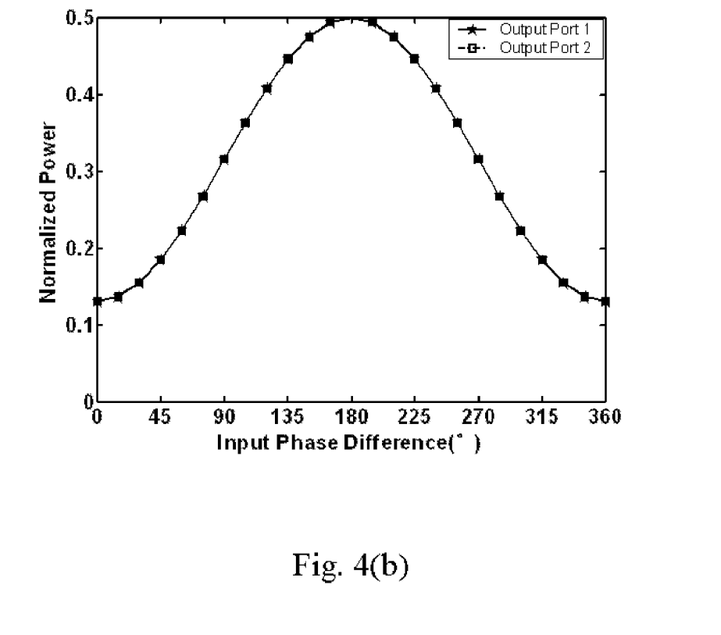

For optimal operation of the coupled ring laser of the present invention, the optical coupler needs to have synchronous output powers, in contrast to the complementary output powers as in conventional quarter-wave couplers. The cross-coupling coefficients have a relative phase φ=mπ(m=0, ±1, ±2, . . . ) with respect to the self-coupling coefficients. This ensures that when the ring resonators 101 and 102 are in resonant conditions (i.e. the round-trip propagation phase changes in both rings are multiples of 2π), the round-trip phase change for the light propagating in the FIG. 8 configuration in the two rings is also a multiple of 2π. FIG. 4(b) shows the ideal power transfer functions of such a coupler for the case m=1 (which is the easiest to realize). When the input fields have opposite phases, the powers at both output ports reach the maximum simultaneously. When the input fields have the same phase, destructive interference occurs at both output ports and the energy is dissipated into radiative modes out of the waveguides. For such a coupler (referred as half-wave optical coupler hereafter), the energy conservation rule requires that the amplitudes of the coupling coefficients satisfy $|C_{11}|+|C_{21}|=1$ and $|C_{12}|+|C_{22}|=1$ for the ideal case when there is no excess loss. In the above example, we have used $C_{11}=C_{22}=0.755$, and $C_{12}=C_{21}=-0.245$. Although we have $|C_{11}|^2+|C_{21}|^2=|C_{12}|^2+|C_{22}|^2<1$, no energy is lost when the two input fields have exactly opposite phases, as shown in FIG. 4(b).

Figure 5:
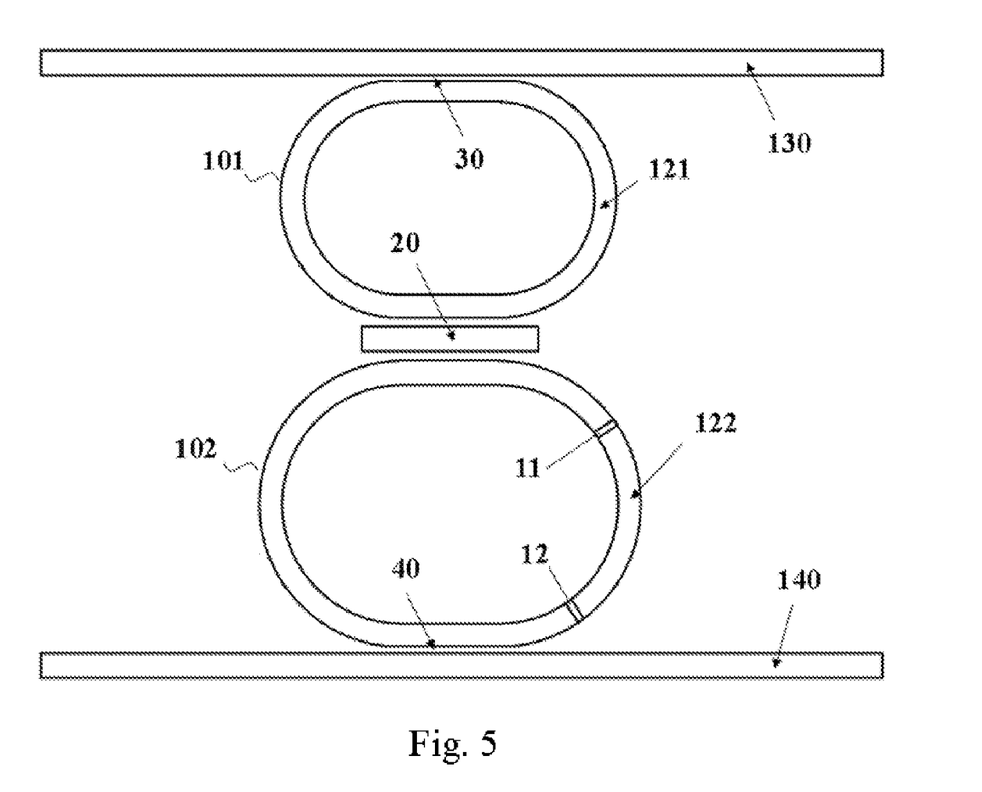
FIG. 5 is schematic of a wavelength switchable semiconductor laser using half-wave coupled ring resonators in accordance with another embodiment of the present invention.
Figure 6:
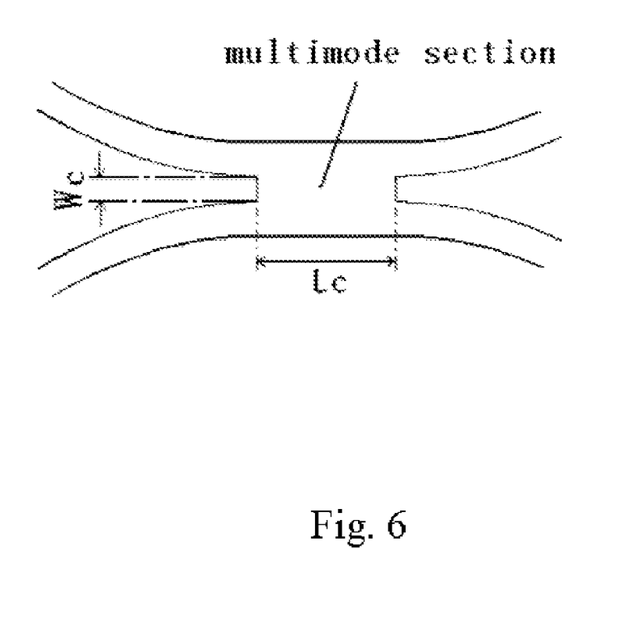
FIG. 6 is a schematic drawing of the multimode coupler 20 with the definition of the coupler length $L_c$ and gap width $W_c$ indicated.

The half-wave optical coupler can be realized in the form of a three-waveguide coupler, i.e., by adding a third waveguide in the middle of a conventional 2×2 directional coupler. The middle waveguide forms a quarter-wave coupler with each of the adjacent input/output waveguides, resulting in a π (i.e. 180°) coupling phase between the input/output waveguides. Theoretically, low coupling loss can be achieved with such a half-wave coupler. The half-wave coupled double ring laser of the present invention using such a half-wave coupler is shown in FIG. 5. However, for fabrication simplicity, we can use a compact 2×2 coupler with a multimode coupling region as shown in FIG. 6 (the complete double ring laser structure is shown in FIG. 1). It can be seen as if the middle waveguide is merged with the adjacent waveguides in the coupling region. An arbitrary cross-coupling coefficient and phase can be achieved by adjusting the length $L_c$ and the gap $W_c$ of the multimode coupling region. However, such a coupler will incur some excess loss. The excess loss ε (in dB) can be calculated by $\epsilon=10 \log_{10}(|C_{11}|^2+|C_{21}|^2+2|C_{11}||C_{21}|\cos(\phi)|)$. From Eq. (13), we can obtain the increased laser threshold gain (in intensity) due to the excess loss $\Delta G=2\Delta g=-\epsilon/(8.686 L)$ when the cross-coupling phase is near 180°.

To analyze the coupled ring resonator laser, for the sake of simplicity we will treat the waveguide in the channel selector resonator 102 as a uniform waveguide with an average effective refractive index of n'. We consider one of the resonators as the main laser cavity and include the coupling effect of the other resonator as an effective transmission coefficient in the round-trip propagation of the main cavity. First, let us consider the fixed gain resonator 101 as the main cavity. The effective transmission coefficient t (in amplitude) taking into account the coupling effect of the channel selector resonator 102 can be calculated by $$t = C_{11} + C_{21}C_{12}\tau' e^{(g'+ik')L'}\left(1 + C_{22}\tau' e^{(g'+ik')L'} + C_{22}^2 \tau'^2 e^{2(g'+ik')L'} + \cdots\right) = C_{11} + \frac{C_{21}C_{12}\tau' e^{(g'+ik')L'}}{1 - C_{22}\tau' e^{(g'+ik')L'}} \quad (15)$$

The threshold condition can therefore be written as $$\tau t e^{(g+ik)L} = 1 \quad (16)$$

In the above equations, k ($=2\pi n/\lambda$) and g are, respectively, the propagation constant and gain coefficient of the waveguide in the fixed gain resonator 101, and k' ($=2\pi n'/\lambda$) and g' are, respectively, the average propagation constant and average gain coefficient of the waveguide in the channel selector resonator 102.

Similarly, we can also consider the channel selector resonator 102 as the main laser cavity. The effective transmission coefficient t' taking into account the coupling effect of the fixed gain resonator 101 can be calculated by $$t' = C_{22} + C_{21}C_{12}\tau e^{(g+ik)L}(1 + C_{11}\tau e^{(g+ik)L} + C_{11}^2\tau^2 e^{2(g+ik)L} + \cdots) = C_{22} + \frac{C_{21}C_{12}\tau e^{(g+ik)L}}{1 - C_{11}\tau e^{(g+ik)L}} \quad (17)$$

The threshold condition for the laser can then be written as $$\tau' t' e^{(g'+ik')L'} = 1 \quad (18)$$

After some manipulation, it can be shown that Eqs. (16) and (18) are identical. They both lead to the same threshold condition Eq. (12) of the coupled double-ring laser.

Now we use a numerical example to illustrate the characteristics of the coupled ring resonator laser. Consider the previously mentioned example where n=n'=3.215, L=466.24 μm ($\Delta f$=100 GHz), and L'=518.31 μm ($\Delta f$=90 GHz). The two ring resonators have a common resonance wavelength at 1550.12 nm, corresponding to a frequency of 193400 GHz. Assume the optical coupler is a perfect half-wave optical coupler with $C_{11}=C_{22}$=0.755, and $C_{12}=C_{21}$=−0.245. We also assume that the input/output couplers 104 and 106 are 3-dB coupler so the transmission coefficients $\tau=\tau'$=0.707 and the two cavities are pumped to produce the same round trip gain, i.e., gL=g'L'. For the lowest threshold mode at the common resonance wavelength of 1550.12 nm, solving equation (12) leads to the threshold gain coefficients (in intensity) G=2 g=7.5 cm$^{-1}$ and G'=2 g'=6.7 cm$^{-1}$.

Figure 7:
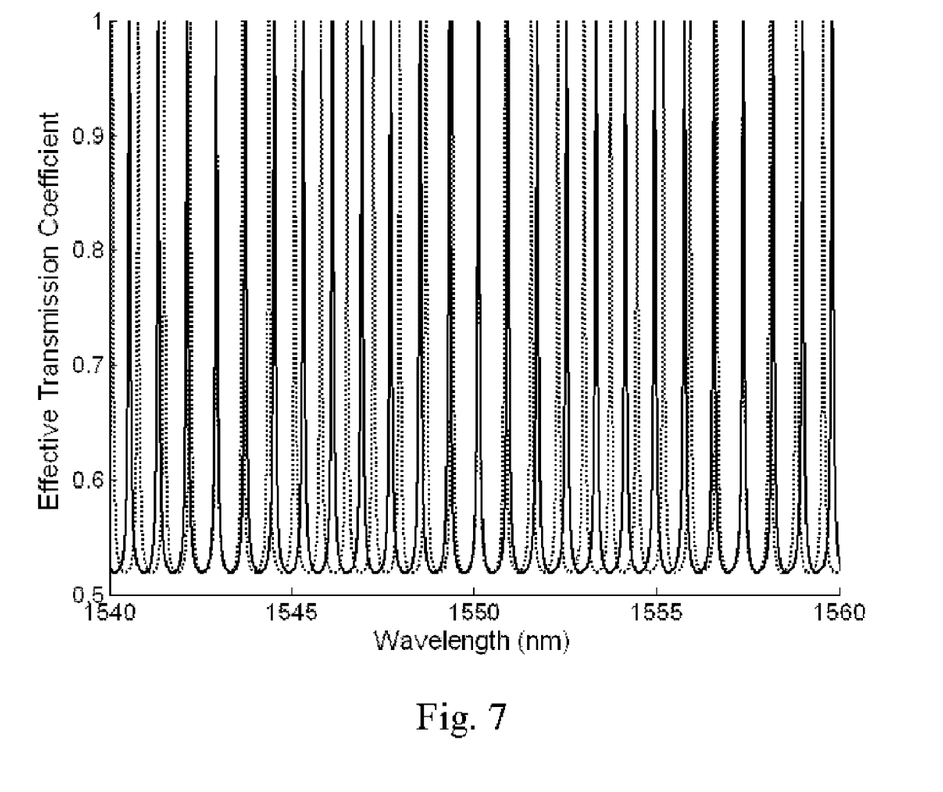
FIG. 7 is the effective transmission coefficient of the coupler in the fixed gain resonator considering the coupling effect of the wavelength selector resonator (dotted line) and the effective transmission coefficient of the coupler in the wavelength selector resonator considering the coupling effect of the fixed gain resonator (solid line) as a function of the wavelength when the laser is pumped at the threshold.

The mode selectivity and the wavelength switching function of the coupled ring resonator laser can be understood from the effective transmission coefficients t and t', which are wavelength dependent functions with sharp resonant peaks. FIG. 7 shows the squared modulus $|t|^2$ (dotted line) and $|t'|^2$ (solid line), which are the effective transmission coefficients in intensity, as a function of the wavelength when the laser is pumped at the threshold. The periodic peaks of the effective transmission coefficient $|t|^2$ occur at the resonant wavelengths of the wavelength selector resonator 102. The effective transmission coefficient $|t|^2$ effectively modifies the round-trip transmission of the fixed gain resonator 101, producing a comb of transmission peaks. Consequently, a resonant mode of the fixed gain resonator that coincides with one of the peaks of the effective transmission coefficient $|t|^2$ is selected as the lasing mode. Since the periodic peaks of the effective transmission coefficient $|t'|^2$ correspond to the resonant wavelengths of the fixed gain resonator, the lasing wavelength occurs at the position where a peak of $|t|^2$ overlaps with a peak of $|t'|^2$.

The mode selectivity, which relates to side-mode suppression ratio (SMSR), is an important consideration in the design of the laser. The mode selectivity can be optimized by appropriately choosing the cross-coupling coefficient. We define the normalized cross-coupling coefficient (in intensity) as $$\chi = \frac{|C_{21}|^2}{|C_{11}|^2 + |C_{21}|^2} = \frac{|C_{12}|^2}{|C_{12}|^2 + |C_{22}|^2} \quad (19)$$

Figure 8:
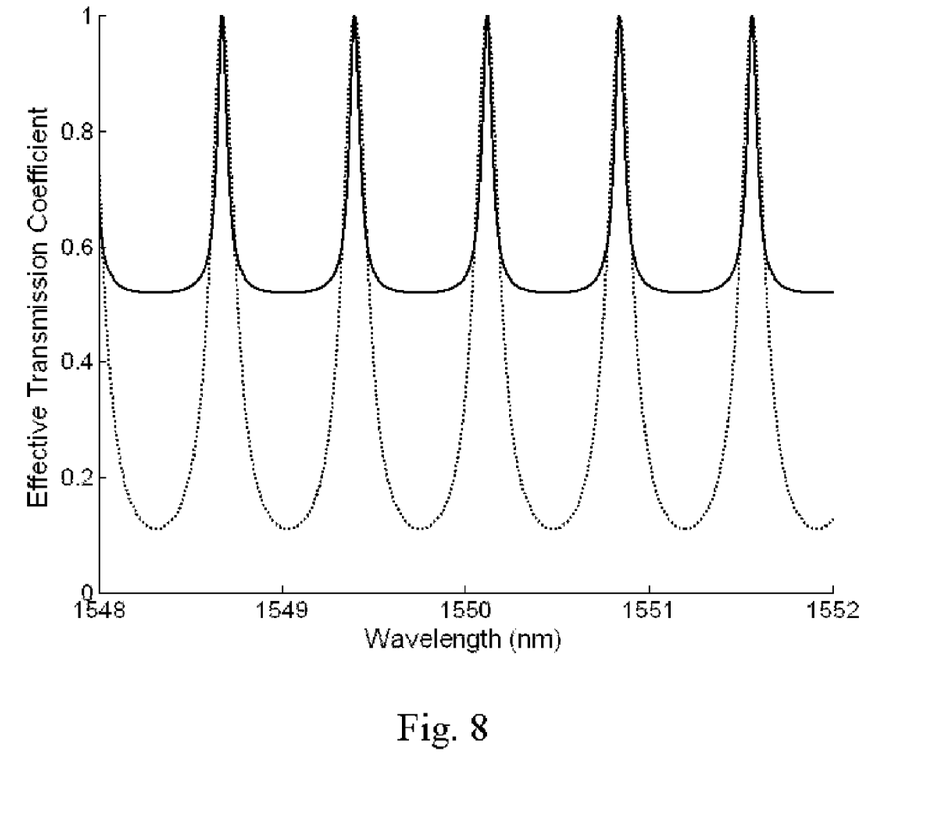
FIG. 8 is the spectra of the effective transmission coefficient of the coupler in the fixed gain resonator for normalized cross-coupling coefficients of 0.1 (solid line) and 0.5 (dotted line).

To illustrate the effect of the cross-coupling coefficient, we calculate the effective transmission coefficient $|t|^2$ as a function of wavelength for different $\chi$ values. FIG. 8 compares the spectra of the effective transmission coefficient $|t|^2$ for $\chi$=0.1 (solid line) and $\chi$=0.5 (dotted line), when the laser is pumped at the lasing threshold. We can see that when the cross-coupling coefficient decreases, the peaks of the effective transmission coefficient $|t|^2$ become narrower while the contrast decreases.

Figure 9:
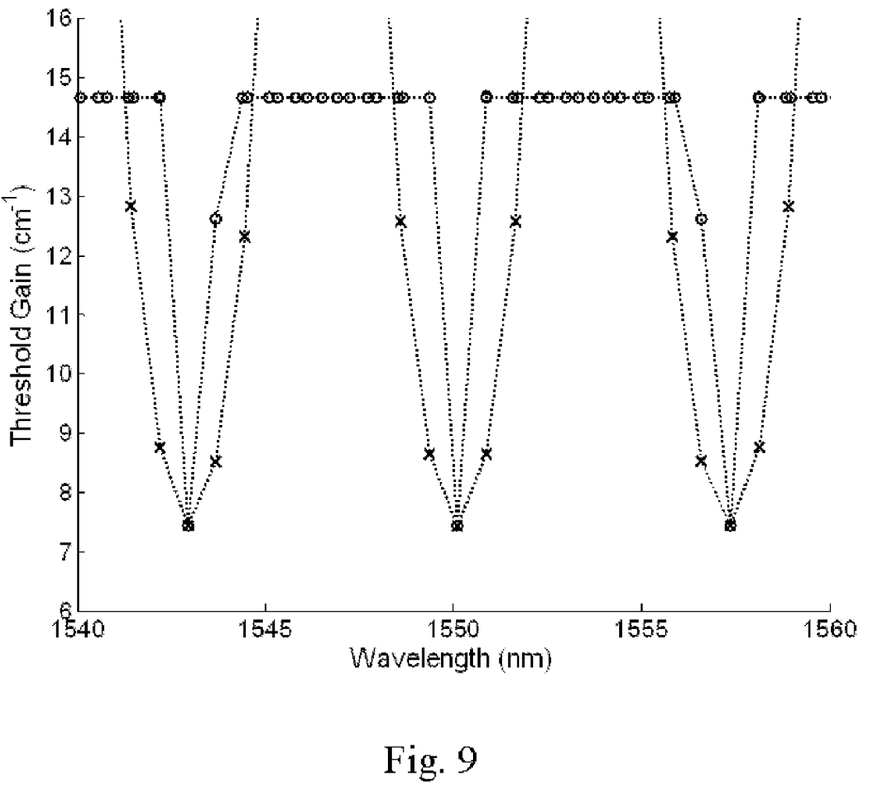
FIG. 9 is the lasing threshold of the modes for two different normalized cross-coupling coefficients of 0.1 (circles) and 0.5 (crosses).

Since the discrimination of side modes is based on the misalignment of resonant modes between the fixed gain resonator and the channel selector resonator, the narrower the effective transmission peaks, the better the mode selectivity between adjacent modes. Quantitatively, the mode selectivity can be characterized by threshold difference between the side modes and the main mode. FIG. 9 shows the lasing threshold of the resonant modes for two different normalized cross-coupling coefficients $\chi$=0.1 (circles) and $\chi$=0.5 (crosses). For the lowest threshold mode at the common resonance wavelength of 1550.12 nm, the threshold difference between the main mode and the next lowest threshold mode is about 7.2 cm$^{-1}$ for $\chi$=0.1, but is only about 1.2 cm$^{-1}$ for $\chi$=0.5.

For a perfect symmetric half-wave coupler without any excess loss, we have $C_{11}=C_{22}=|C_{11}|$, $C_{12}=C_{21}=-|C_{21}|$, and $|C_{11}|+|C_{21}|$=1. When the two cavities are pumped with equal round-trip gains, from Eqs. (9) and (10) we can derive $\beta$=−1 for the common resonant mode with the lowest threshold.

Figure 10:
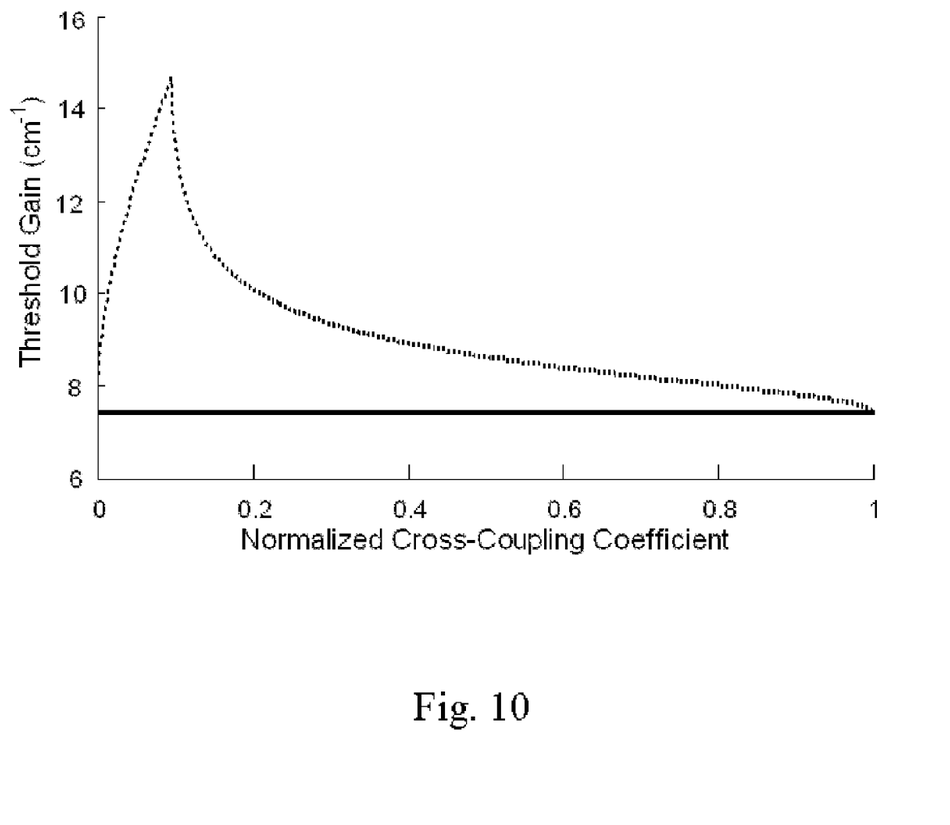
FIG. 10 is the threshold gain coefficient of the lowest threshold mode (solid line) and the next lowest threshold mode (dotted line) as a function of the normalized cross-coupling coefficient.

In FIG. 10, we show the threshold gain coefficient G (in intensity, G=2 g) of the lowest threshold mode (solid line) and the next lowest threshold mode (dotted line) as a function of the normalized cross-coupling coefficient $\chi$. We can see that the threshold of the main mode is independent of $\chi$. The largest threshold difference between the lowest threshold mode and the next lowest threshold mode occurs around $\chi$=0.1. The threshold difference increases as $\chi$ decreases from 1 to 0.1, because the peak width of the effective transmission coefficient $|t|^2$ decreases, resulting in an increased selectivity between the main mode and its adjacent modes. As $\chi$ further decreases to below 0.1, the threshold difference decreases. This is because the peak width of the effective transmission coefficient $|t|^2$ becomes narrower than the mode spacing and it no longer affects the threshold difference. Instead, the threshold difference is determined by the contrast in the effective transmission coefficient $|t|^2$ which decreases with the decreasing cross-coupling coefficient.

Figure 11:
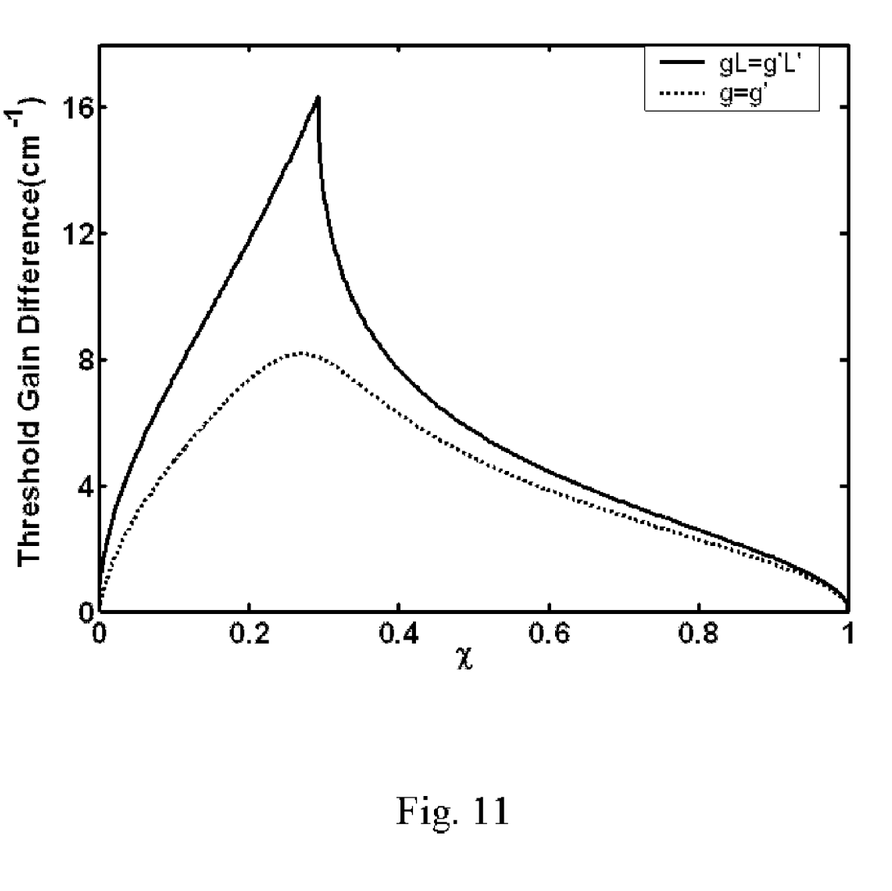
FIG. 11 is the threshold gain difference between the lowest threshold mode and the next lowest threshold mode as a function of the normalized cross-coupling coefficient $\chi$ for two different pumping conditions corresponding to gL=g'L' (solid line) and g=g' (dotted line). The cavity length difference is doubled compared to the example of FIG. 10.

By increasing the length difference between the fixed gain resonator and the channel selector resonator, the threshold difference between the lowest threshold mode and the next lowest threshold mode can be increased, at the expense of reduced free spectral range as determined by Eq. (3). It is also found that the maximum threshold difference is achieved when the simple round trip gains in the two resonators are equal, i.e. $\tau e^{2gL} = \tau' e^{2g'L'}$. Consider the case L=466.24 μm (Δf=100 GHz) and L'=582.68 μm (Δf=80 GHz) with other parameters the same as in the previous example. FIG. 11 shows the threshold difference between the lowest threshold mode and the next lowest threshold mode as a function of the cross-coupling coefficient for two different pumping conditions corresponding to gL=g'L' (solid line) and g=g' (dotted line). Compared to the previous example, the cavity length difference is doubled, and the free spectral range $\Delta f_c$ is reduced from 900 GHz to 400 GHz. The maximum achievable threshold difference is increased from 7.2 cm$^{-1}$ to 16 cm$^{-1}$ (for the case gL=g'L'), and the optimal cross-coupling coefficient at which the maximum threshold difference is achieved is increased from 0.1 to 0.29.

As it can also be seen in FIG. 11, the maximum achievable threshold difference decreases as the pumping condition deviates away from the optimal condition of gL=g'L' (or more generally, equal round trip gains). Therefore, it is preferable that gain variations be avoided when the refractive index of the channel selector resonator is changed to switch the laser wavelength. This can be realized by using a separate tuning section in the channel selector resonator which is substantially passive (with little gain or loss), as shown in FIG. 1. This also allows flexible output power control independent of the wavelength switching.

Figure 12:
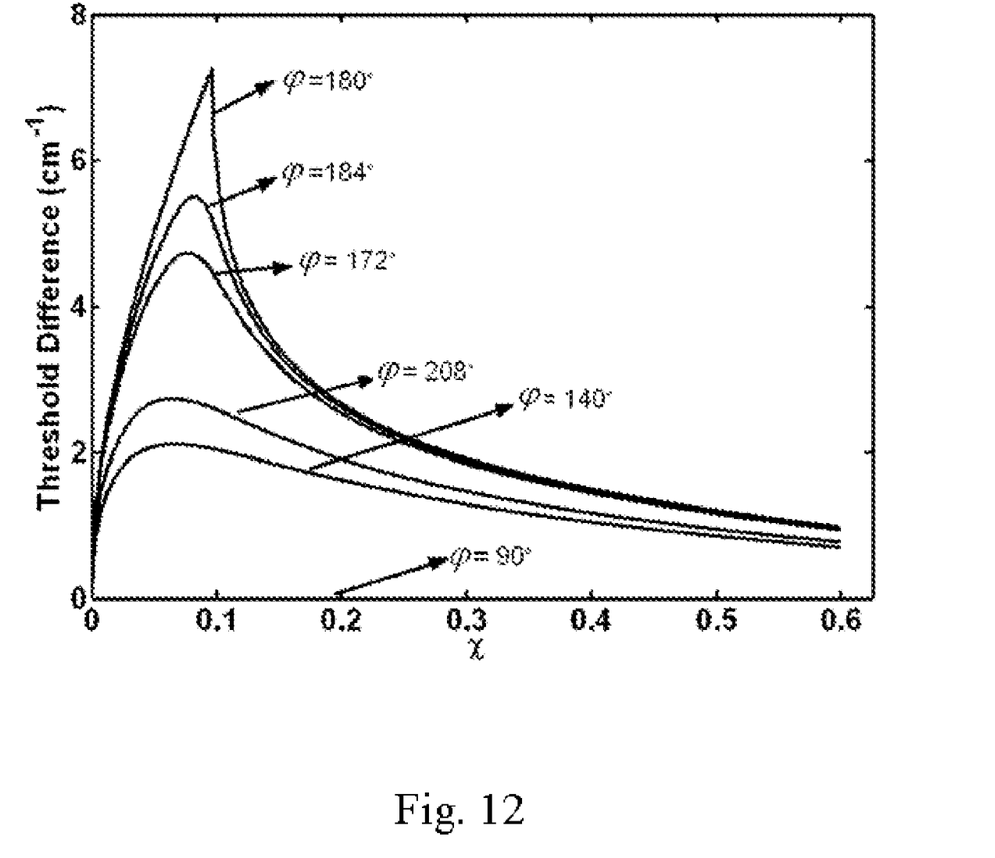
FIG. 12 is the threshold gain difference versus the normalized cross-coupling coefficient for different cross-coupling phases.

Ideally the optical coupler 20 is a half-wave optical coupler. As the cross-coupling phase deviates away from half-wave (i.e. 180°), the maximal threshold gain difference decreases. FIG. 12 shows the threshold gain difference versus normalized cross-coupling coefficient χ for different cross-coupling phases. When the cross-coupling phase deviates from 180°, the peak decreases and becomes less pointed. The optimal cross-coupling coefficient $\chi_{opt}$ at which the maximal threshold gain difference occurs also decreases. For conventional directional couplers with 90° coupling phase, the threshold difference becomes zero, which means there is no mode selectivity.

Figure 13:
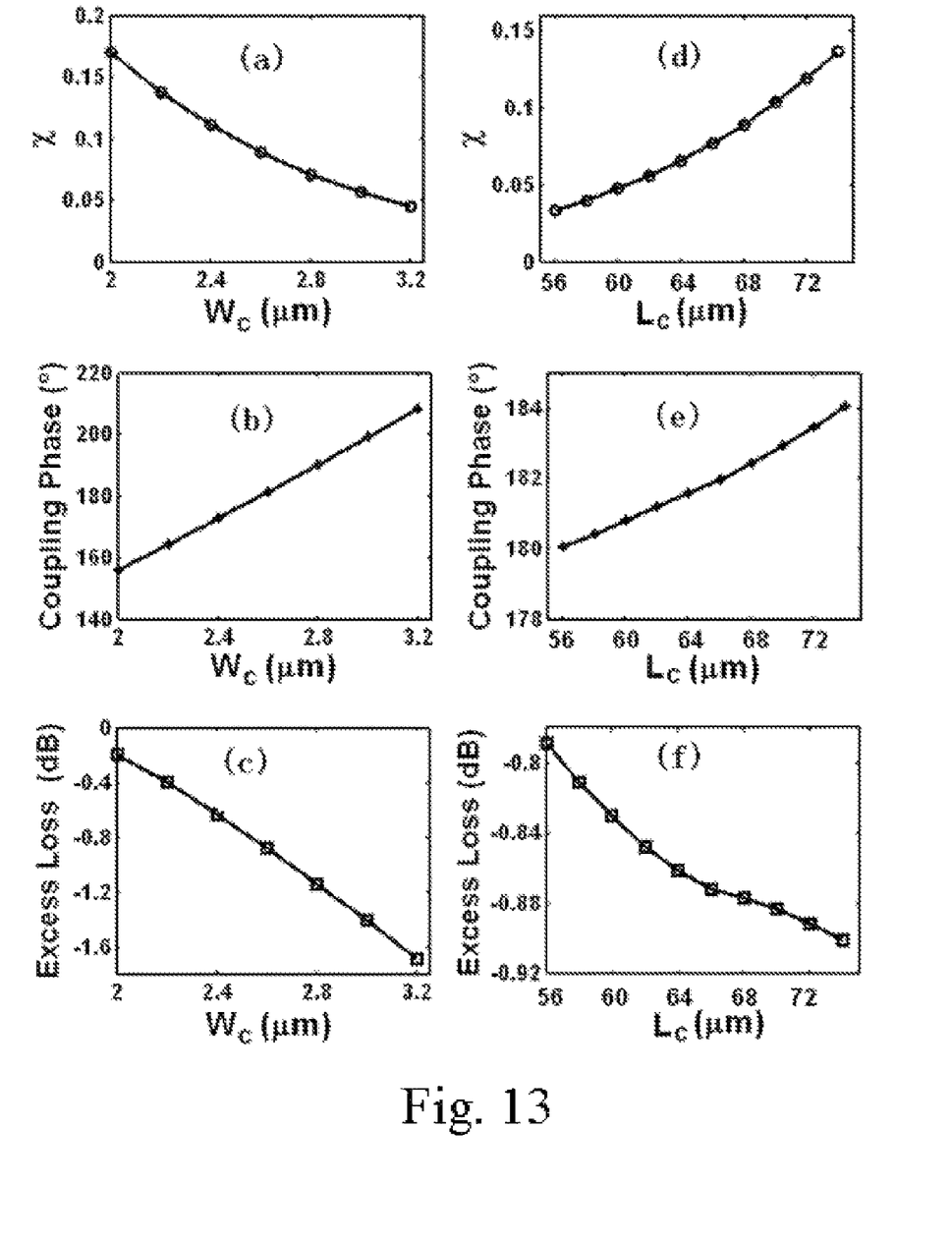
FIG. 13 is the variations of the cross-coupling coefficient, cross-coupling phase and excess loss versus the width and length of the coupling region.

Now let us consider the 2×2 optical coupler with a multimode coupling region as shown in FIG. 6. An arbitrary cross-coupling coefficient and phase can be achieved by adjusting the length $L_c$ and the gap $W_c$ of the multimode coupling region, with a certain amount of excess loss. Assume the effective indices of the waveguide and the cladding regions are 3.220 and 3.189, respectively. The width of the waveguide is 3 μm. Using two-dimensional Beam Propagation Method (BPM), we obtain the variations of the normalized cross-coupling coefficient, phase, and the excess loss as a function of the gap $W_c$ as illustrated in FIGS. 13(a), (b) and (c), respectively. The length of the coupling region is fixed at $L_c$=68 μm. Their variations with the coupling length $L_c$ are shown in FIGS. 13 (d), (e) and (f) for a fixed gap $W_c$=2.6 μm. We can see that the cross-coupling coefficient increases with $L_c$ and decreases with $W_c$. The coupling phase mainly depends on the gap $W_c$, although the coupling length $L_c$ also slightly affects the coupling phase. When $W_c$=2.6 μm and $L_c$=68 μm, the coupling phase approximately equals to 180° and we have $C_{11}=C_{22}=0.689$, and $C_{12}=C_{21}=310.217$. The normalized cross-coupling coefficient is about 0.09. The excess loss is −0.86 dB, which results in an increase of 2.1 cm$^{-1}$ in the threshold gain. It does not affect the threshold gain difference which only depends on the normalized cross-coupling coefficient χ and the cross-coupling phase φ.

It can also be envisaged to divide the waveguide of the fixed gain resonator 101 into two sections, each with a separate electrode, one for providing a fixed gain, and the other for continuously tuning the resonant wavelength grid of the fixed gain resonator over a channel spacing. By combining this wavelength tuning with the wavelength switching of the wavelength selector resonator, any wavelength over a wide continuous range can be obtained.

Figure 14:
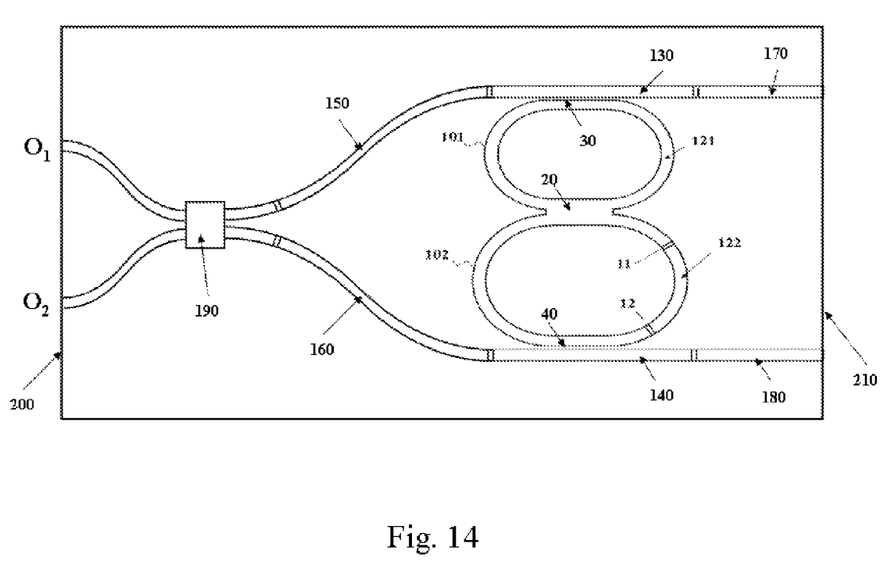
FIG. 14 is another embodiment of the present invention in which a Mach-Zehnder interferometer is integrated with the half-wave coupled double ring laser to realize space switching, variable optical attenuation or high-speed modulation functions.

An extra-cavity Mach-Zehnder interferometer can be integrated with the half-wave coupled double-ring laser to realize space switching, variable optical attenuation or high-speed modulation functions. FIG. 14 shows one embodiment of the integrated multi-functional device. A 2×2 MMI coupler is used to combine the light propagating in the two waveguides 130 and 140 and direct the output power into one of the output ports $O_1$ and $O_2$. At least one electrode is deposited on top of the waveguide branches 150 and 160 to switch the output between the ports $O_1$ and $O_2$, or to perform variable optical attenuation or high-speed modulation function. The output facet 200 is anti-reflection (AR) coated so that no reflection from the facet 200 is fed back to the laser resonator. The bandgap energies of various sections of the waveguides are appropriately tailored using the quantum-well intermixing (QWI), selective area epitaxy (SAE) or etch-and-regrowth technique to meet the requirements for different functions.

In the above we have only considered the light propagating in the counter clock wise direction in the ring resonator 101 and clock wise direction in the ring resonator 102. In principle, the double-ring laser can support another mode of the same wavelength propagating in the opposite direction. This lasing mode is coupled to the output waveguides 130 and 140 in the opposite propagation direction towards the back facet 210. The competition between the two modes can cause instability of the laser. To suppress this undesired mode, electrodes can be deposited on top of the waveguide sections 170 and 180 to adjust the phase of the light reflected from the back facet 210 (no AR coating is deposited on this facet). Alternatively, this phase can be controlled by an electrical signal through at least one of the electrodes on the waveguide sections 170 and 180, or by an optical signal through an input light coupled into one of the waveguide sections 170 and 180. Through the cross-gain modulation between the two competing modes, low-chirp high speed modulation and optical wavelength conversion can be realized, in addition to the wavelength switchability of the laser.

Numerous other embodiments can be envisaged without departing from the spirit and scope of the invention.

What is claimed is:

1. A semiconductor laser comprising:
   a first optical ring resonator comprising a first optical waveguide, at least a portion of said first optical waveguide being sandwiched between a pair of electrodes for injecting an electrical current to provide optical gain,
   a second optical ring resonator comprising a second optical waveguide, at least a portion of said second optical waveguide being sandwiched between a pair of electrodes for injecting an electrical current to provide optical gain,
   whereas the first and the second optical ring resonators have different round-trip optical path lengths, and are coupled to each other through a 2×2 optical coupler, said 2×2 optical coupler having predetermined cross-coupling coefficients that are substantially less than self-coupling coefficients and cross-coupling phases that are substantially equal to an integer multiple of π relative to self-coupling phases for achieving an optimal single-mode selectivity of the laser.

2. A semiconductor laser as defined in claim 1, wherein the 2×2 optical coupler is a half-wave optical coupler with the cross-coupling phase substantially equal to π relative to self-coupling phases.

3. A semiconductor laser as defined in claim 2, wherein the half-wave optical coupler is realized using evanescent coupling via a third optical waveguide placed between the first optical waveguide of the first optical ring resonator and the second optical waveguide of the second optical ring resonator.

4. A semiconductor laser as defined in claim 3, wherein the 2×2 optical coupler is realized using a multimode coupling region formed by merging the middle third waveguide with the adjacent first and second waveguides in the coupling region, said multimode coupling region having a predetermined length and gap in order to achieve said predetermined cross-coupling coefficients and said cross-coupling phases relative to self-coupling phases.

5. A semiconductor laser as defined in claim 1, wherein at least a portion of each of said first and second optical waveguides is pumped electrically by current injection to provide substantially equal round-trip optical gains for the first and the second optical ring resonators in order to achieve maximum threshold difference between the lowest threshold mode and the next lowest threshold mode.

6. A semiconductor laser as defined in claim 1, wherein the first optical ring resonator has an optical path length such that its resonant frequencies correspond substantially to a set of discrete operating channels separated by a constant channel spacing.

7. A semiconductor laser as defined in claim 6, wherein the optical path length of the first optical ring resonator is designed such that its resonant frequencies correspond substantially to a set of discrete operating channels separated by an integer multiple of 50 GHz.

8. A semiconductor laser as defined in claim 1, wherein a variable current or voltage is applied to at least a portion of the second optical waveguide in order to change its refractive index and consequently to switch the laser frequency among the discrete channels as determined by the resonant frequencies of the first optical ring resonator.

9. A semiconductor laser as defined in claim 8, wherein the portion of the second optical waveguide under variable current or voltage has a larger bandgap energy as compared to the separate portion of the second optical waveguide which is pumped to provide optical gain.

10. A semiconductor laser as defined in claim 1, wherein the optical path length difference between the first and the second optical ring resonators is less than 20 percent.

11. A semiconductor laser as defined in claim 1 further comprises a third optical waveguide coupled to the first optical ring resonator and a fourth optical waveguide coupled to the second optical ring resonator, said third and fourth optical waveguides are connected to two output ports through a second 2×2 optical coupler.

12. A semiconductor laser as defined in claim 11 wherein the output ports have an antireflection coated output facet.

13. A semiconductor laser as defined in claim 12 wherein the third and fourth optical waveguides comprise at least an electrode deposited on top of a waveguide segment between the ring resonator and the second 2×2 optical coupler for applying an electrical signal to switch the output power between the two output ports, to vary the output power, or to modulate the output power at high speed.

14. A semiconductor laser as defined in claim 11 wherein the third and fourth optical waveguides comprise at least an electrode deposited on top of a waveguide segment between the ring resonator and the back facet of the laser for applying an electrical signal to change the refractive index and consequently to change the output power emitted from the front end of the laser.

15. A semiconductor laser as defined in claim 11 further comprises an input optical port at the back facet to receive an input optical signal, said input optical signal being coupled into the ring resonators through at least one of the third and fourth waveguides, thereby modulating the output power of the laser.

* * * * *